(12) United States Patent
Gao et al.

(10) Patent No.: US 8,853,839 B2
(45) Date of Patent: Oct. 7, 2014

(54) AIR-RELEASE FEATURES IN CAVITY PACKAGES

(71) Applicant: Analog Devices, Inc., Norwood, MA (US)

(72) Inventors: Jia Gao, Winchester, MA (US); Jicheng Yang, North Andover, MA (US); Shafi Saiyed, Lynnfield, MA (US); Siu Lung Ng, Stoneham, MA (US); Xiaojie Xue, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/645,094

(22) Filed: Oct. 4, 2012

(65) Prior Publication Data

US 2013/0093031 A1 Apr. 18, 2013

Related U.S. Application Data

(60) Provisional application No. 61/544,852, filed on Oct. 7, 2011.

(51) Int. Cl.
*H01L 23/495* (2006.01)

(52) U.S. Cl.
USPC ........... 257/676; 257/698; 257/704; 257/713; 257/787; 438/22; 438/48

(58) Field of Classification Search
USPC .......... 257/676, 689, 704, 698, 787, 713–714
See application file for complete search history.

(56) References Cited

U.S. PATENT DOCUMENTS

| 5,223,747 | A | * | 6/1993 | Tschulena ..................... 257/713 |
| 5,447,601 | A | | 9/1995 | Norris |
| 5,656,776 | A | * | 8/1997 | Otani .............................. 73/493 |
| 6,946,728 | B2 | | 9/2005 | Chen et al. |
| 7,692,288 | B2 | | 4/2010 | Zhe et al. |
| 7,821,554 | B2 | * | 10/2010 | Ma et al. ........................ 348/294 |
| 7,923,791 | B2 | | 4/2011 | Huang et al. |
| 8,230,743 | B2 | * | 7/2012 | Wade et al. ..................... 73/706 |
| 2002/0021874 | A1 | | 2/2002 | Giboney et al. |
| 2005/0122100 | A1 | | 6/2005 | Wan et al. |
| 2006/0081969 | A1 | | 4/2006 | Ku |
| 2007/0202627 | A1 | | 8/2007 | Minervini |
| 2008/0012085 | A1 | | 1/2008 | Cheng et al. |
| 2008/0079142 | A1 | | 4/2008 | Carmona et al. |
| 2008/0157301 | A1 | | 7/2008 | Ramakrishna et al. |
| 2009/0026597 | A1 | | 1/2009 | Yim |
| 2009/0116669 | A1 | | 5/2009 | Song |

(Continued)

OTHER PUBLICATIONS

International Search Report and Written Opinion received in International Patent Application No. PCT/US2012/058769, dated Feb. 15, 2013, filed on Oct. 4, 2012; in 16 pages.

*Primary Examiner* — Dung A. Le

(74) *Attorney, Agent, or Firm* — Knobbe, Martens, Olson & Bear LLP

(57) ABSTRACT

A housing for integrated devices that includes an air-release mechanism is disclosed. This is achieved, in various embodiments, by forming a vent hole in a package substrate, and arranging a package lid over the package substrate. The vent hole allows air to be released from within the cavity package, thereby ensuring that the package lid remains stably affixed to the package substrate despite increased temperatures during processing. The vent hole may be sealed upon mounting the package onto a mounting substrate.

53 Claims, 14 Drawing Sheets

(56) References Cited

U.S. PATENT DOCUMENTS

| | | |
|---|---|---|
| 2009/0179233 A1 | 7/2009 | Lee et al. |
| 2009/0213262 A1 | 8/2009 | Singh et al. |
| 2010/0090295 A1 | 4/2010 | Zhe et al. |
| 2011/0053321 A1 | 3/2011 | Huang |
| 2011/0156106 A1 | 6/2011 | Lee et al. |
| 2011/0198714 A1 | 8/2011 | Yang |
| 2012/0270354 A1* | 10/2012 | Hooper et al. .......... 438/51 |

* cited by examiner

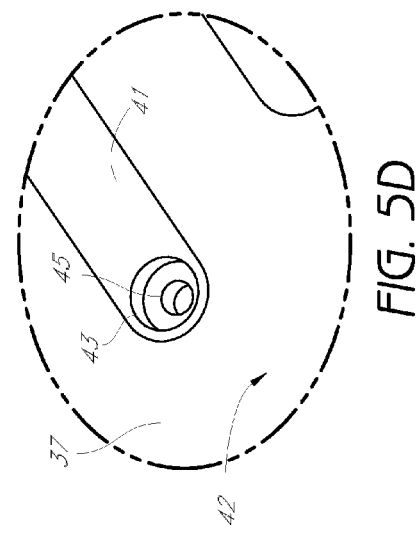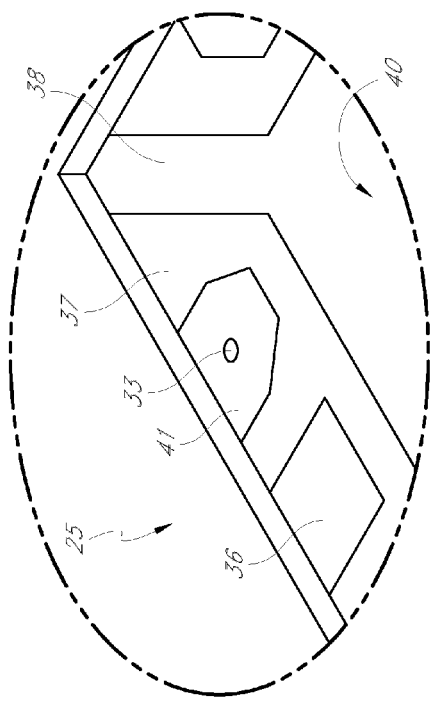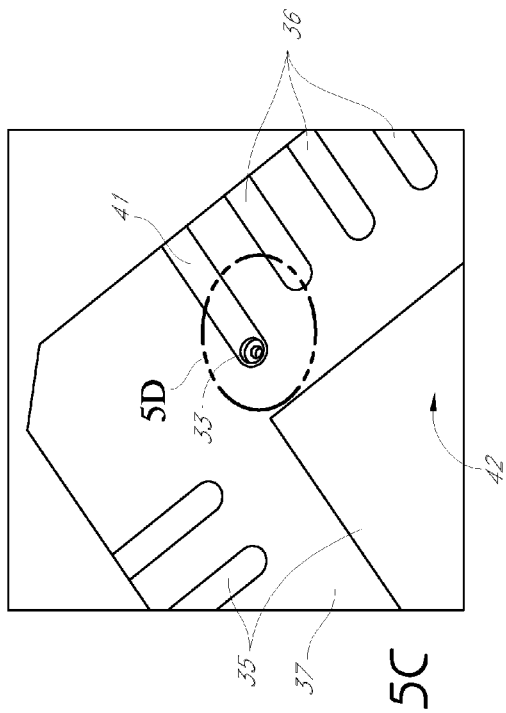

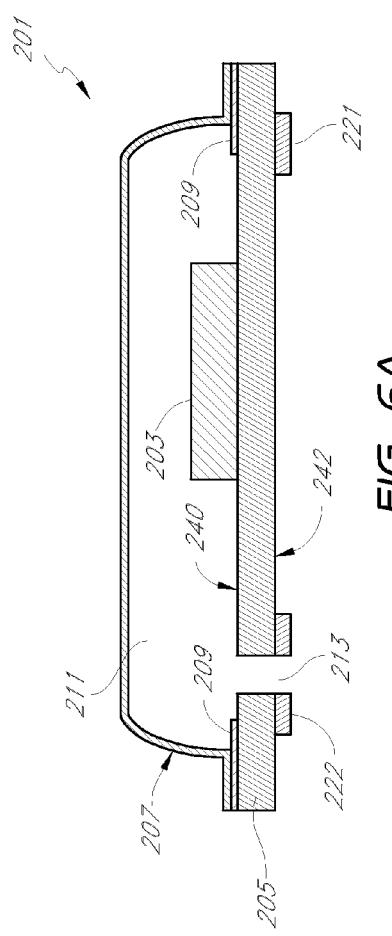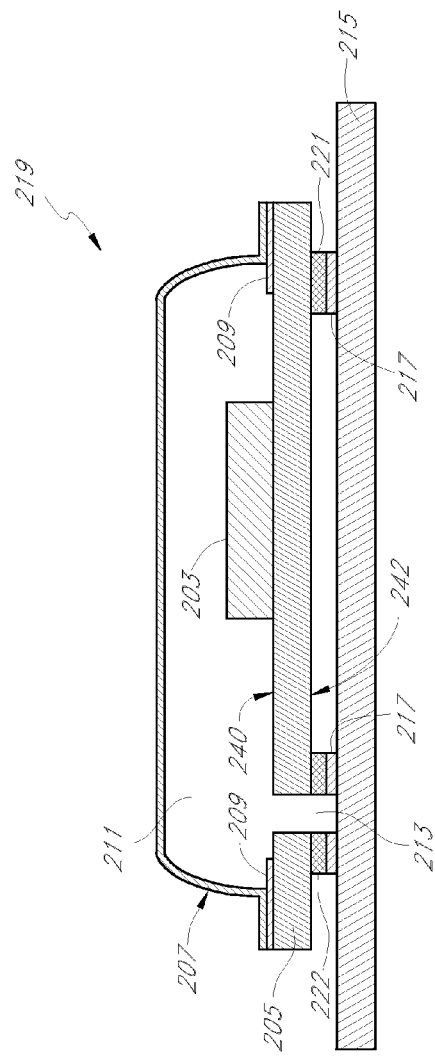

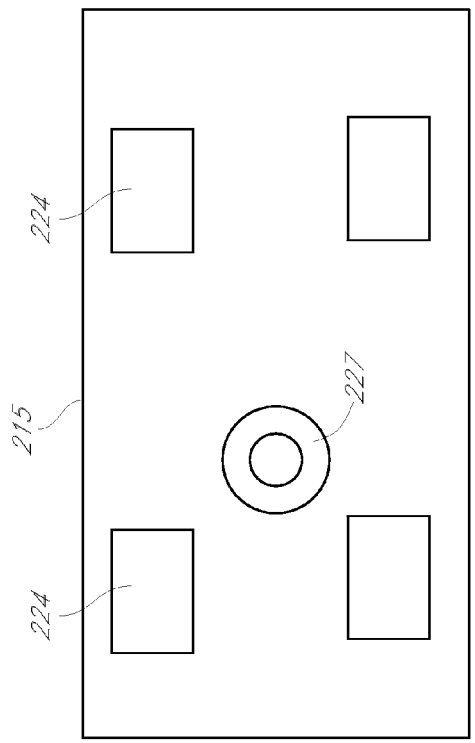
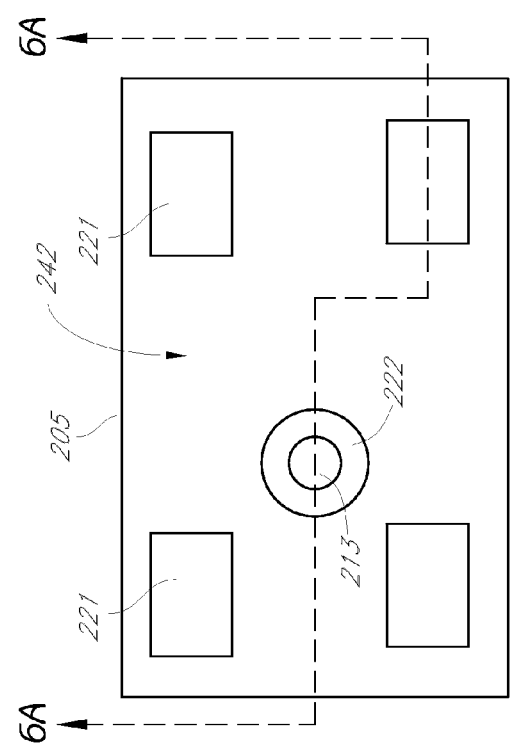

AIR-RELEASE FEATURES IN CAVITY PACKAGES

CROSS-REFERENCE TO RELATED APPLICATIONS

The present application claims the benefit under 35 U.S.C. §119(e) of U.S. Provisional Patent Application No. 61/544,852, filed on Oct. 7, 2011, entitled "SYSTEMS AND METHODS FOR AIR-RELEASE IN CAVITY PACKAGES," the entire contents of which is hereby incorporated by reference herein in its entirety and for all purposes.

BACKGROUND OF THE INVENTION

1. Field of the Invention

The present application relates to device packages and methods for making the same.

2. Background

Integrated devices, such as integrated circuit (IC) devices or microelectromechanical systems (MEMS) devices, are often secured within a package for a variety of reasons, including, for example, environmental protection, radio frequency (RF) shielding, and/or to aid in connecting the devices to a larger circuit. The device packages can include a package lid mounted to a package substrate, which together define a housing around a cavity. Such cavity packages are particularly advantageous for applications involving MEMS devices, such as motion sensors, that are sensitive to stress. Sealing such devices in an epoxy encapsulant or glob top may result in undesirable stress to the devices due to different coefficients of thermal expansion. Such packages should withstand exposure to temperature variations during processing, testing, and use.

SUMMARY OF THE INVENTION

In one embodiment, a device package is provided. The device package includes a package housing that defines a cavity. A motion sensor die is mounted within the housing, and a hole extends through the housing. The illustrated configuration facilitates the release of air from the cavity when the cavity is subject to increased temperatures during processing.

In another embodiment, a device package comprises a package substrate that has an upper surface and a bottom surface. The package substrate includes a leadframe and a molding material. In this embodiment, the molding material surrounds portions of the leadframe. A hole extends through the leadframe from the upper surface of the package substrate to the bottom surface of the package substrate.

In yet another embodiment, a device package comprises a package substrate that has an upper surface and a bottom surface. A hole extends from the upper surface of the package substrate to the bottom surface of the package substrate, such that a portion of the hole intersects the bottom surface and defines a perimeter on the bottom surface of the package substrate. The device package further includes an annular metal trace that is positioned substantially around the perimeter of the hole. In some further embodiments, the annular metal trace may be electrically isolated.

In yet another embodiment, a method of integrating a motion sensor with an outside electronic circuit is provided. In this method, a package substrate with a vent hole therethrough is provided. A motion sensor die is mounted on the package substrate, and a lid is attached to the package substrate to form a housing enclosing the motion sensor die but for the vent hole.

In another embodiment, a method of mounting a packaged motion sensor device to an external board is provided. The method comprises providing a package housing that includes a cavity, a motion sensor die, and a vent hole. The motion sensor die is mounted within the housing, and the vent hole extends through the housing. The method further includes simultaneously mounting the package housing to an external board and sealing the vent hole.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The invention and various embodiments and features may be better understood by reference to the following drawings in which:

FIG. 5B shows an enlarged detail view of the vent hole shown in FIG. 5A.

FIG. 5C shows a schematic view of the bottom surface of the molded leadframe substrate shown in FIG. 5A.

FIG. 5D shows an enlarged detail view of the bottom surface of the vent hole shown in FIG. 5C.

FIG. 6A shows a schematic cross-section of a MEMS device package with a vent hole in a plastic package substrate, according to one embodiment.

FIG. 6B shows a schematic cross-section of the MEMS device package shown in FIG. 6A, coupled to a mounting substrate.

FIG. 7A shows a schematic bottom view of a package substrate, according to one embodiment.

FIG. 7B shows a schematic top view of a mounting substrate, according to one embodiment.

DETAILED DESCRIPTION OF EMBODIMENTS

Figure 1:
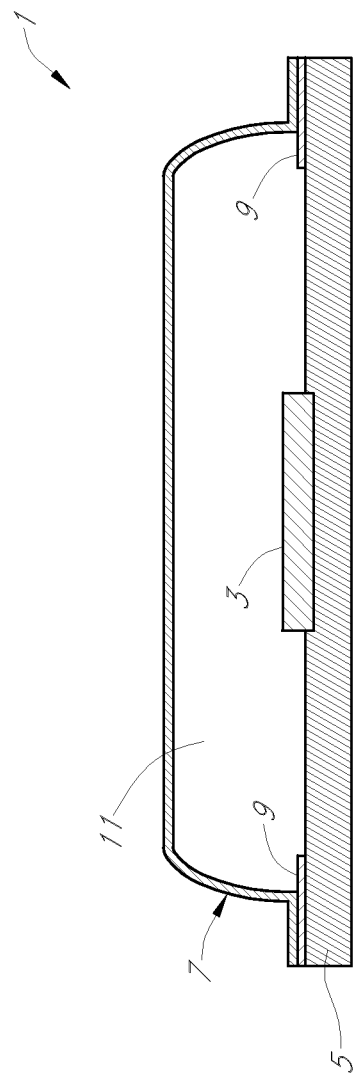
FIG. 1 shows a schematic side cross-section of a device package.

The following detail description of certain embodiments presents various descriptions of specific embodiments of the invention. However, the invention can be embodied in myriad different ways as defined and covered by the claims. In this description, reference is made to the drawings where like reference numerals indicate identical or functionally similar elements. The drawings are schematic and not to scale.

Device Packages

FIG. 1 is a cross-section of a conventional device package 1 according to one embodiment. As noted above, for various reasons, integrated devices are often encapsulated within packages. One such package is known as a cavity package, where a housing defines a cavity in which a die is mounted and electrically connected. In the example of FIG. 1, the integrated device 3 is physically and electrically coupled with a package substrate 5. As noted above, the integrated device 3 may be, for example, an integrated circuit die or a MEMS die. A package lid 7 is arranged over the integrated device 3 and connects to the package substrate 5 with an adhesive 9 applied at the interface of the package substrate 5 and package lid 7. The area between the package substrate 5 and the package lid 7 defines a cavity 11. In certain embodiments, the package lid 7 may be conductive (e.g., metal or coated with metal). This may allow the package lid 7 to be electrically grounded, thereby providing an RF shield to protect integrated device 3 encapsulated within the package. In such embodiments, it is advantageous to use a conductive adhesive 9, and solder is often employed for sealing conductive lids to package substrates.

The size of packages can vary greatly depending on the number and type of dies mounted therein. State-of-the-art motion sensor packages can have dimensions for the package substrate 5 between about 3-4 mm across, with the package lid 7 being approximately 1-2 mm across. The thickness of the package substrate 5 may be approximately 0.3 mm in some embodiments, although the thickness could range from about 0.1 mm to about 10 mm in other applications. In other embodiments, the thickness could be larger or smaller. The package substrate 5 can be configured to electrically connect the device package 1 to a larger electric device, such as through a printed circuit board (motherboard) and/or any other suitable electrical apparatus. The package substrate 5 can include, for example, one or more external power, communication, or ground leads on outside or lower surfaces. The package substrate 5 can include internal or upper surface contact pads, surface traces and buried interconnects and/or through vias that electrically connect the integrated device to the external leads. The packaging substrate 5 may be a printed circuit board (PCB), molded leadframe, ceramic or any other packaging substrate.

After mounting and electrically connecting the integrated device 3 to the package substrate 5, e.g. by flip chip connections or wirebonding, the cavity 11 is typically joined to the package substrate 5 by the application of adhesive 9 at the junction of the package lid 7 and the package substrate 5. The adhesive 9 may be, for example, epoxy or solder. Solder reflows at a significantly higher temperature than epoxy, and therefore solder generally provides a stronger bonding strength at high temperatures than epoxy. For example, epoxy may reflow at temperatures of approximately 150° C., while solder, depending on the particular alloy used, may reflow at temperatures of approximately 260° C. However, the use of solder often results in solder contaminating the integrated device, with possibly deleterious effects on performance, particularly for stress-sensitive dies, such as MEMS motions sensors, which are often left unencapsulated within the package. Adhesives like epoxy have the advantage that high temperature soldering processes and attendant contamination issues can be avoided. However, there is a tendency for such adhesives to demonstrate reduced reliability, particularly upon impact. Additionally, the lower reflow temperature of epoxy may result in decreased bonding strength at high temperatures.

During the process of sealing the package lid 7 to the package substrate 5, increased temperatures are typically applied to the device package 1. Epoxy curing can be at temperatures of 150° C. or more for extended periods of time. Soldering also involves high temperatures applied to the device package 1, e.g., at about 260° C., as explained above. Under either approach, the temperature of the air within the cavity 11 increases during application of the adhesive 9. If the cavity 11 is hermetically sealed, as is often desired for motion sensor packages, any increase in temperature of the air within the cavity 11 may increase the pressure on the inside of the package lid 7, in accordance with the ideal gas law. At high temperatures, the pressure within the cavity 11 increases while at the same time the adhesive 9 adjoining the package lid 7 and the package substrate 5 tends to soften, thereby causing the package lid 7 to tilt, deform, or pop off.

As noted above, this displacement of the package lid 7 may occur during sealing of the package lid 7 to the package substrate 5, e.g., during epoxy cure or solder reflow. Displacement of the package lid may also occur later, when the device package 1 is separately mounted onto a mounting substrate and soldered in place. Soldering the package to a mounting substrate may likewise increase the temperature of the package substrate 5, which in turn increases the temperature of the air within the cavity 11. The increased temperature, and therefore increased internal pressure, of the cavity 11, may decrease the bonding strength of the adhesive 9 due to reflow. As the reflow temperature of epoxy is significantly lower than that of solder, this effect is more pronounced when the adhesive 9 is epoxy. Soldering the device package 1 to a mounting substrate may increase the temperature of the package substrate 5 enough to soften the adhesive 9. As the adhesive 9 approaches reflow temperature, the bonding strength is reduced. This combination of decreased bonding strength and increased pressure within the cavity 11 may result in the package lid 7 tilting or popping off when the package lid 1 is mounted to a mounting substrate.

Figure 2A:
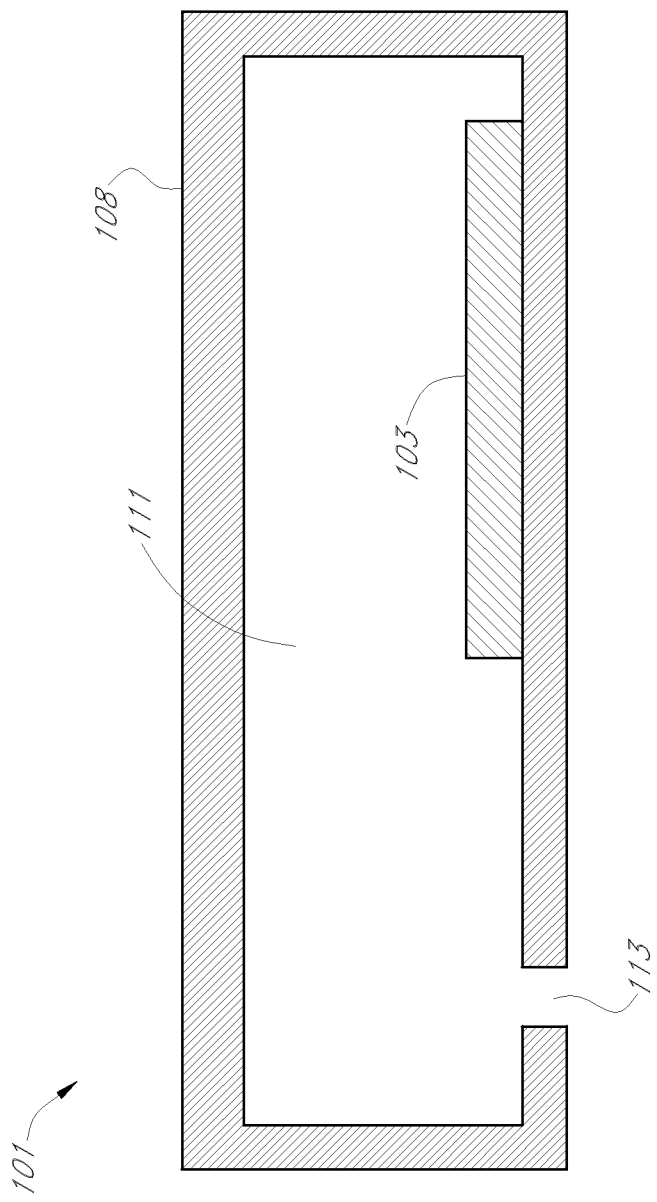
FIG. 2A shows a schematic side cross-section of a housing with a vent hole, according to one embodiment.

FIG. 2A shows a schematic side cross-section of a device package 101 in accordance with an embodiment. The device package 101 includes a housing 108 which substantially encapsulates an integrated device 103 within a cavity 111. A vent hole 113 provides a pathway for air to pass into and out of cavity 111. In situations involving increased temperatures during packaging or subsequent board mounting of the package, increased pressure within the cavity 111 is released through the vent hole 113, thereby avoiding the problems described above relating to lid tilt, deformation, and/or popping off.

The housing may take various forms. In certain embodiments, the housing may be a substantially planar substrate with a separate, shaped lid attached thereto, which covers the integrated device. In other embodiments, the housing may be a flat lid over a flat substrate, with intermediate printed circuit board (PCB) or other material disposed between the lid and the substrate, defining the cavity therebetween which encapsulates the integrated device. In still other embodiments, the integrated device 103 may be mounted onto a lid, which is attached to a substrate, with a cavity defined therebetween. In other embodiments, the housing may include a substrate shaped to define a cavity, with a substantially planar lid attached thereto. Such shaped substrates may, for example, be made from ceramic or molded plastic. The vent hole 113 can open to a lower surface of the package 101 that also has leads that will be connected into a larger circuit, e.g., on a motherboard.

Figure 2B:
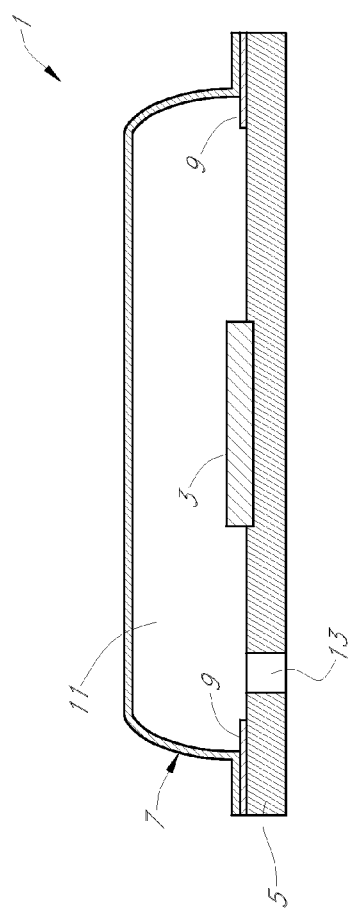
FIG. 2B shows a schematic side cross-section of a device package with a vent hole, according to one embodiment.

FIG. 2B shows a side cross-section of a device package 1 similar to that shown in FIG. 1, with the addition of a vent hole 13 formed through the package substrate 5. As noted with respect to FIG. 2A, the vent hole 13 advantageously provides a means for air to pass into and out of the cavity 11 during packaging or subsequent board mounting, thereby reducing some of the problems described above relating to lid tilt and/or popping off. For example, as explained above, the vent hole 13 can prevent the lid 7 from tilting or popping off when attaching the lid 7 to the package substrate 5, or when attaching the package 1 to a mounting substrate.

Figure 2C:
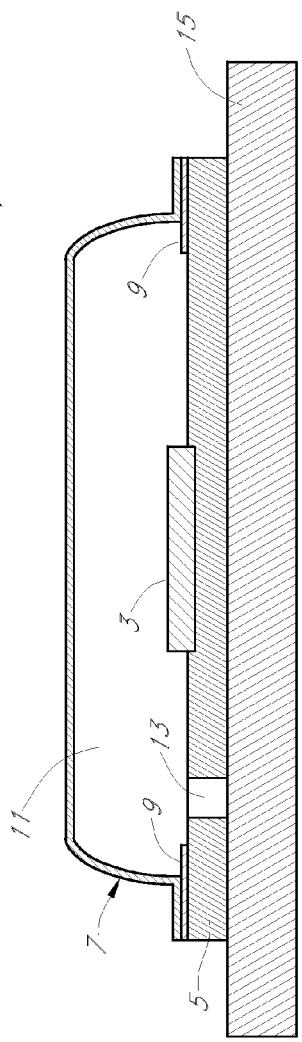
FIG. 2C shows a schematic side cross-section of the device package shown in FIG. 2B, coupled to a mounting substrate.

So as not to interfere with operation of the integrated device 3, the vent hole 13 may be laterally spaced from the integrated device 3 that is mounted on the substrate 5. The vent hole 13 may be formed of any suitable shape. For example, in various embodiments, the vent hole 13 may be circular, rectangular, oval, square, or any other suitable shape. As one example, the vent hole 13 of FIG. 2A-2C is round. Dimensions of the hole may vary. In some embodiments, the vent hole 13 may be round or circular with a diameter of between about 25 µm and about 1 mm. In other embodiments, the diameter of the vent hole 13 may be between about 100 µm and about 600 µm. Although shown with a single vent hole 13, additional vent holes may be added as desired. The vent hole 13 may be formed in the package substrate 5 either before or after the integrated device 3 is mounted thereon. Methods for forming the vent hole 13 may vary. The vent hole 13 may be formed using standard lithographic techniques, such as wet or dry etching, by laser drilling, or by mechanical means, depending in part upon the nature of the package substrate 5.

FIG. 2C shows a cross-section view of the device package 1 shown in FIG. 2A, now mounted onto a mounting substrate 15. Mounting substrate 15 may be, for example, a printed circuit board for a larger device, such as an automobile component or a smart phone. In affixing the device package 1 onto mounting substrate 15, the vent hole 13 may be simultaneously sealed. For example, solder that is used for connecting leads from the package 1 to traces on the mounting substrate 15 may also be used to partially fill the vent hole 13, thereby blocking air passage into and out of the cavity 11. Sealing the vent hole 13 may provide protection against any undesired contaminants which may enter the open vent hole and potentially damage or interfere with operation of the integrated device 3.

In other embodiments, the vent hole 13 may remain unsealed, even after mounting the device package 1 onto the mounting substrate 15. Depending on the desired application, it may be desirable to keep the vent hole open after mounting. For example, MEMS accelerometers or gyroscopes used in certain automobile applications may be subject to substantial thermal cycling, in which the device package experiences wide ranges of temperatures. As described above, an open vent hole may provide an outlet to release pressure within the cavity, and thereby avoid displacement of the package lid during operation of the integrated device under high temperatures. Placement of the hole on the same side of the package 1 as the leads can reduce the amount of contamination that can reach the hole relative to holes on more exposed surfaces of the package.

Figure 3A:
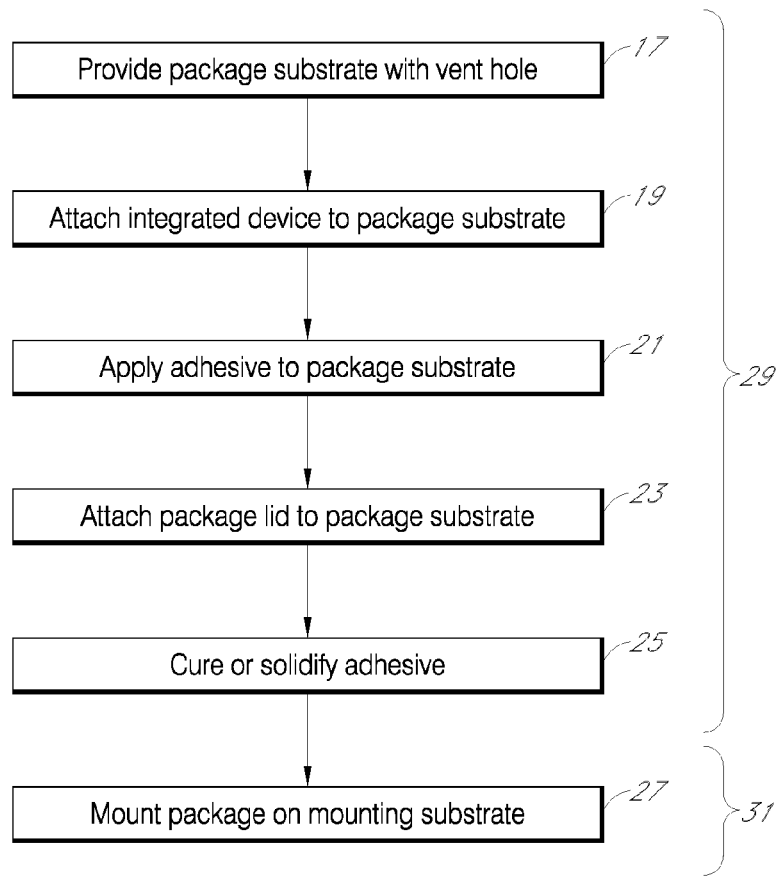
FIG. 3A shows a flowchart illustrating a method for forming and mounting a device package, according to one embodiment.

FIG. 3A shows a flow chart illustrating a method of forming and mounting a packaged integrated device, according to one embodiment. As shown in FIG. 3A, a packaging process 29 can be performed to package an integrated device, and a board mounting process 31 can be performed to mount the packaged device to a mounting substrate or board of a larger product, such as an automobile or electronic device. The packaging process 29 begins in a Block 17 by providing a package substrate with a vent hole. As described above, the package substrate may be a printed circuit board (PCB), molded leadframe, ceramic or any other package substrate, and particular examples are described below with respect to FIGS. 4A-7B. Also noted above, the vent hole may be formed by any number of approaches, including, for example, masking and etching, laser drilling, or mechanical drilling. The packaging process 29 then moves to a Block 19 to attach an integrated device to a package substrate. As noted previously, the integrated device may be an IC device or a MEMS device. In other embodiments, the integrated device may be attached to the package substrate prior to formation of the vent hole.

The packaging process 29 then proceeds to a Block 21 to apply adhesive to the package substrate. As explained herein, an epoxy or solder may be used as the adhesive, in addition to any other suitable adhesives. However, the use of epoxy as an adhesive can avoid some of the problems associated with soldering as discussed above. In addition, curing the epoxy can be conducted at lower temperatures than soldering. Next, a Block 23 describes attaching the package lid to the package substrate. For example, in various embodiments, the package lid can be positioned over the package substrate, and the perimeter or edges of the lid may be pressed against the adhesive. Attaching the package lid to the package substrate can thereby form a housing enclosing the integrated device (e.g., a motion sensor die) except for the vent hole. Following the attachment in Block 23, the packaging process 29 can proceed to a Block 25 to cure or otherwise solidify the adhesive. For example, when the adhesive is epoxy, the epoxy may be cured. The curing temperature and times will vary depending on the composition of the epoxy. One example curing process involves application of about 175 degrees Celsius for about one hour. In various implementations, the adhesive may be cured by exposure to light, e.g., ultraviolet radiation, in addition to or in place of heat treatment.

Thus, Blocks 17, 19, 21, 23, and 25 together may be considered part of the packaging process 29, by which the device package is formed. The packaging process 29 is typically performed by the integrated device manufacturer or a packaging subcontractor, prior to delivery to customers for end-use applications or for incorporation into other products.

Figure 3B:
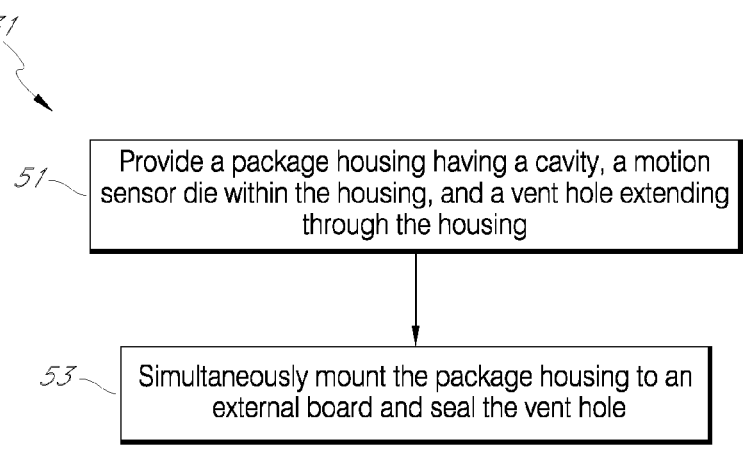
FIG. 3B shows a flowchart illustrating one method for mounting the device package to a mounting substrate, according to one embodiment.

Moving to the board mounting process 31, a Block 27 of FIG. 3A describes mounting the package onto a mounting substrate, as described above, using an adhesive such as solder or epoxy. FIG. 3B is a flowchart illustrating an example of the board mounting process 31 in more detail, according to one embodiment. In a Block 51, the board mounting process 31 provides a package housing having a cavity, a motion sensor die mounted within the housing, and a vent hole extending through the housing. The process 31 proceeds to a Block 53 to simultaneously mount the package housing to an external board and seal the vent hole. In other embodiments the vent hole can be sealed independently of the mounting process; in still other embodiments, the vent hole can be left unsealed. As explained above with respect to FIGS. 2A-2C, it can be advantageous to seal the vent hole when mounting the package housing to the mounting substrate (e.g., to prevent contamination of the die while still reducing the risk of lid displacement or deformation). In various arrangements, the board mounting process 31 can be performed by the customer of the integrated device supplier. The customer typically purchases the device package formed by the packaging process 29, and then mounts it for end use or for incorporation into another product for sale. In some situations, special instructions for board mounting may be supplied from the integrated device manufacturer or supplier, such as techniques for sealing the vent hole during board mounting.

Molded Leadframe Package Substrate

One example of a package substrate is a molded leadframe. Many device packages employ a metallic leadframe that has been stamped or etched from a metal sheet to provide electrical interconnects to external devices. The integrated device may be electrically connected to the leadframe through the use of bonding wires, solder bumps, or other electrical connections. In a molded leadframe, portions of the leadframe are embedded in a molding material while leaving selected portions of the leadframe exposed to facilitate electrical connections to a chip or die on one side, and to external devices on the other side. Leadframe packages can be found in various forms, including, for example, leadframe chip scale package (LFCSP), small-outline integrated circuit (SOIC), low-profile quad flat package (LQFP), plastic leaded chip carrier (PLCC), thin-shrink small-outline package (TSSOP), quarter small outline package (QSOP), and more.

Figure 4A:
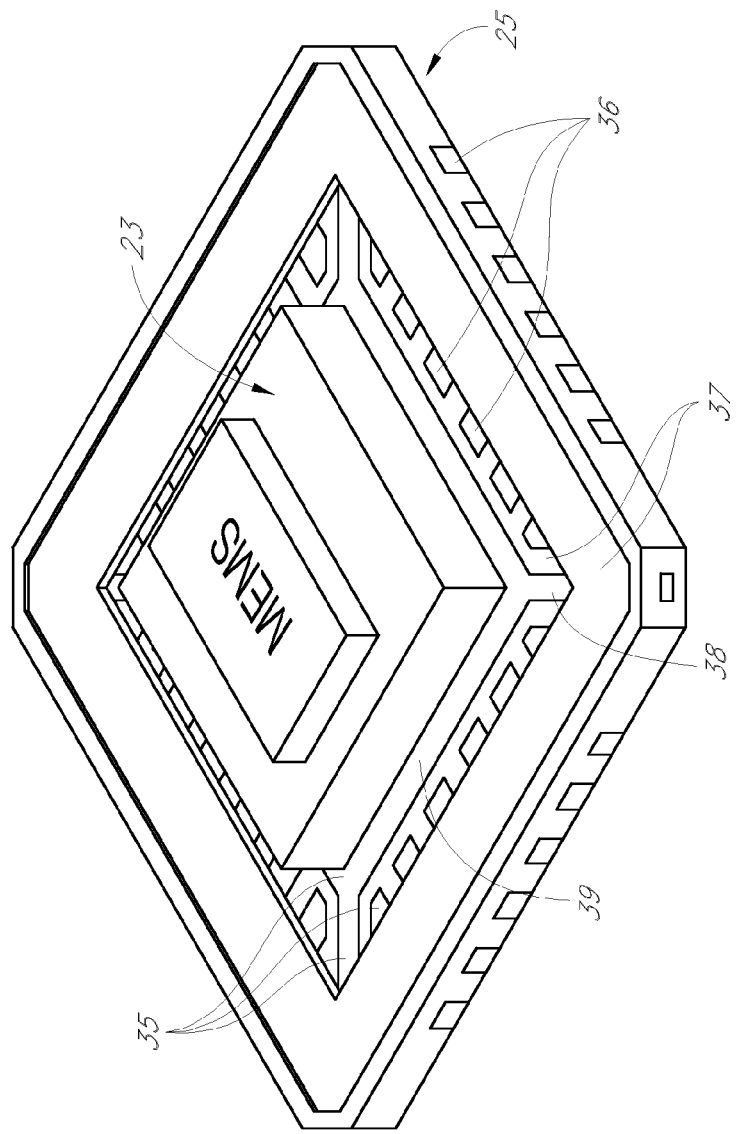
FIG. 4A shows a schematic perspective view of a MEMS device on a molded leadframe substrate, according to one embodiment.

FIG. 4A depicts a MEMS die 23 mounted onto a molded leadframe substrate 25. The MEMS die 23 may be a motion sensor, for example, a gyroscope or accelerometer. In other embodiments, the MEMS die 23 may be replaced by an integrated circuit (IC) die, or both a MEMS die and an IC die can be packaged together. Still other types of integrated device dies may be mounted to the molded leadframe substrate 25. The illustrated molded leadframe substrate 25 can include a leadframe 35 embedded in or covered by a molding material 37. The leadframe 35 can include a die attach pad 39 configured to support an integrated device die, such as the MEMS die 23. The leadframe 35 includes a plurality of electrically conductive leads 36 that can surround the die attach pad 39 and can be electrically isolated from one another and from the die attach pad 39. The leads 36 can be exposed on a bottom surface of the molded leadframe substrate 25 to electrically connect to a mounting substrate or motherboard. In various embodiments, the leadframe 35 can include one or more tie bars 38 configured to support the die attach pad 39 during processing and/or packaging.

Figure 4B:
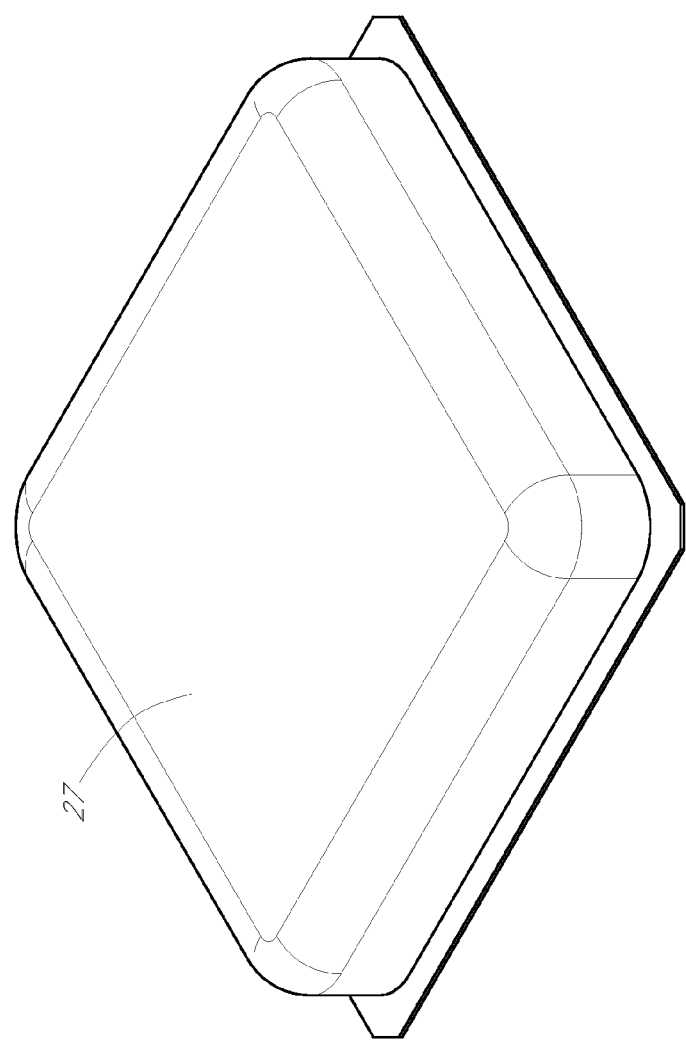
FIG. 4B shows a schematic perspective view of a shaped package lid, according to one embodiment.
Figure 4C:
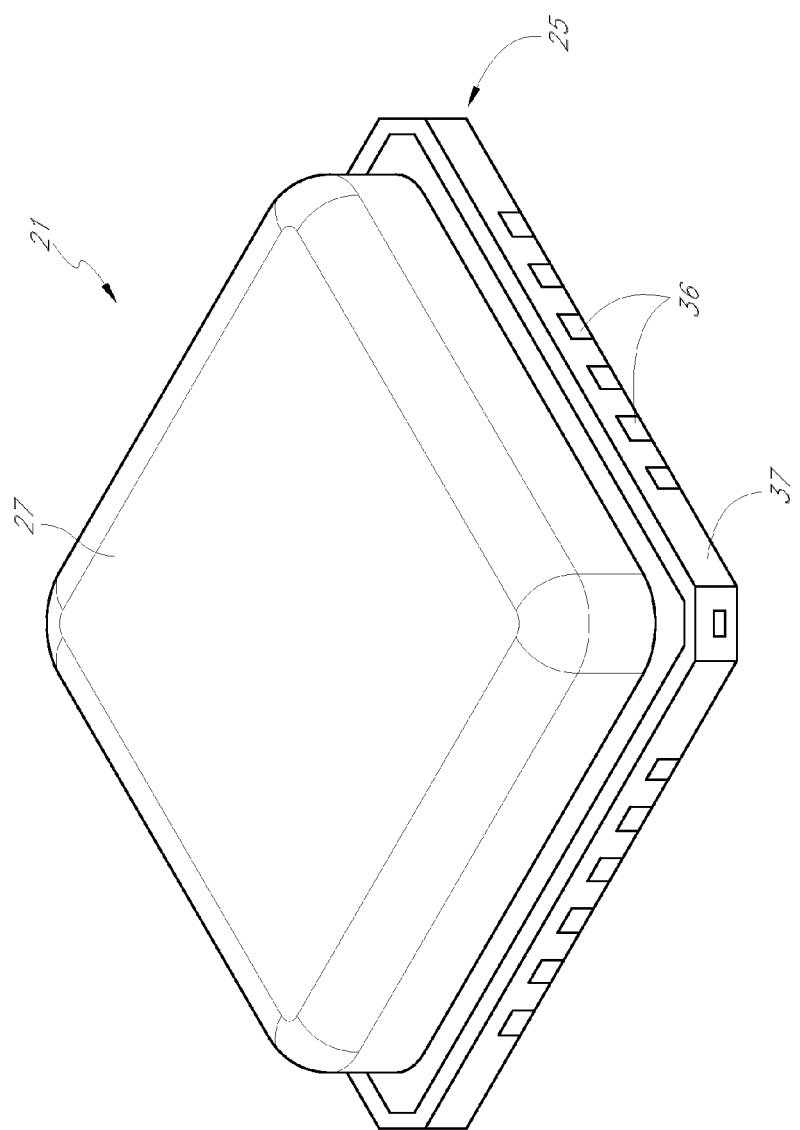
FIG. 4C shows a schematic perspective view a MEMS package including the package lid shown in FIG. 4B arranged over the molded leadframe substrate shown in FIG. 4A.

FIG. 4B shows a shaped package lid 27 designed to fit over the molded leadframe substrate 25 of FIG. 4A to encapsulate the MEMS die 23. The shaped package lid 27 is shaped to include a concavity that ultimately forms a cavity within the packaged device. The package lid 27 can be formed of any suitable material, such as, e.g., a metal, plastic, or ceramic. In some embodiments, for example, a metallic lid may be used as the package lid 27 in order to provide RF shielding to the die 23. Plastic or ceramic lids can also provide RF shielding by including of continuous or meshed metal coatings. FIG. 4C shows a device package 21 in which the package lid 27 of FIG. 4B has been mounted over and sealed to the molded leadframe substrate 25, thus housing the MEMS die 23 shown in FIG. 4A. The package lid 27 may be attached by the use of an adhesive. For example, epoxy, solder, or heat swaging may be used as adhesives to attach the package lid 27 to the molded leadframe substrate 25.

Figure 4D:
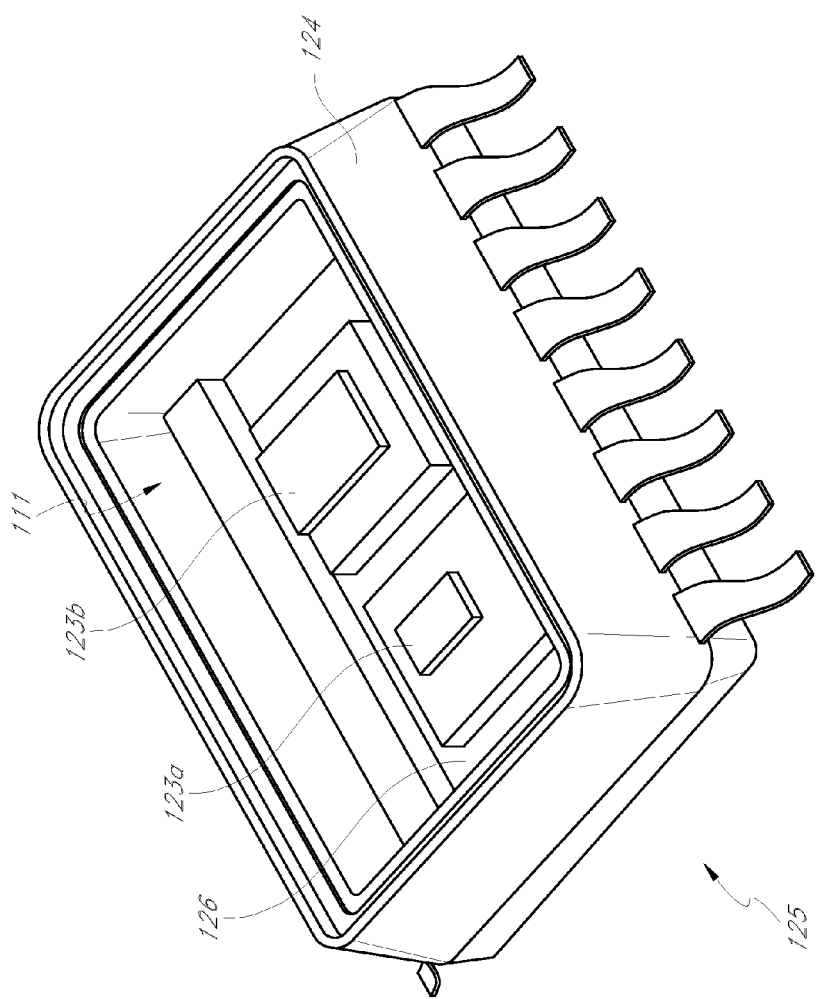
FIG. 4D shows a schematic perspective view of a MEMS device on a molded leadframe substrate, according to another embodiment.
Figure 4E:
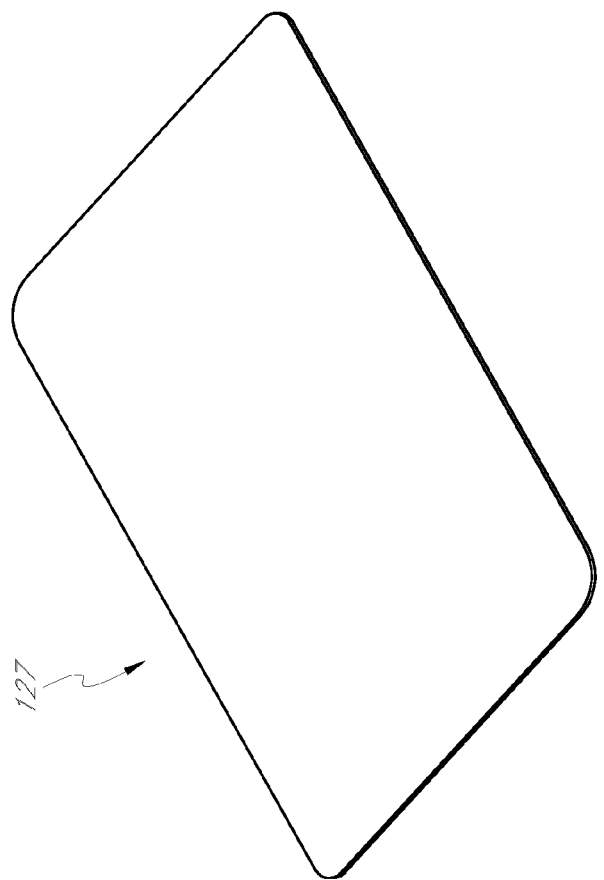
FIG. 4E shows a schematic perspective view of a substantially planar package lid, according to another embodiment.
Figure 4F:
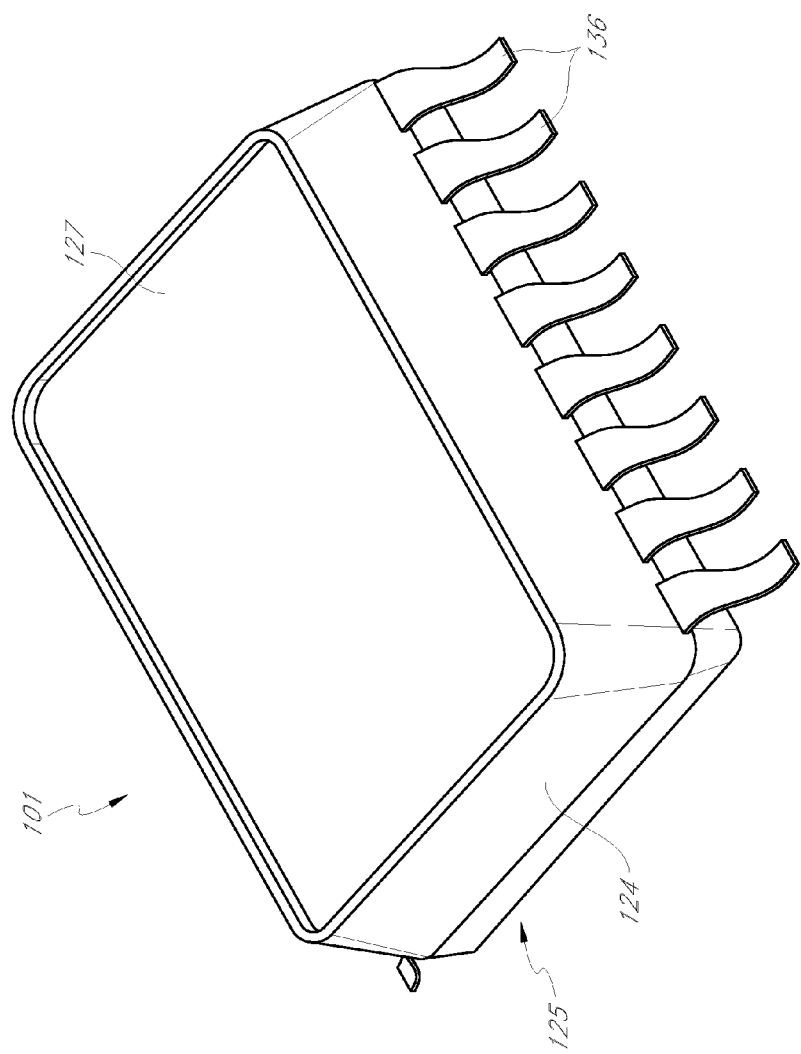
FIG. 4F shows a schematic perspective view of a MEMS package including the package lid shown in FIG. 4E arranged over the molded leadframe substrate shown in FIG. 4D.

FIGS. 4D-4F depict another embodiment of one or more integrated device(s), including a MEMS die, mounted onto a molded leadframe substrate 125, and covered with a substantially planar or flat lid 127, illustrated in FIGS. 4E-4F. As shown in FIG. 4D, for example, a first integrated device die 123a and a second integrated device die 123b may be mounted to the molded leadframe substrate 125. Alternatively, as with FIG. 4C, only one integrated device die may be used in the package. In some embodiments, both dies 123a, 123b may be MEMS dies. In other embodiments, one die 123a or 123b may be a MEMS die, while the other die 123a or 123b may be an IC die.

Unlike the molded leadframe substrate 25 shown in FIG. 4A, the molded leadframe substrate 125 in FIG. 4D is a cavity small-outline integrated circuit (SOIC) package substrate 125. In this cavity SOIC package substrate 125, the package substrate 125 is shaped to define a cavity 111. For example, as shown in FIG. 4D, the SOIC package substrate 125 may include walls 124 extending from a base 126. Accordingly, rather than receiving a shaped lid as depicted in FIG. 4B, the cavity SOIC package substrate 125 receives a substantially planar or flat lid 127 as shown in FIG. 4E. FIG. 4F shows a completed device package 101 with the flat lid 127 of FIG. 4E mounted over the molded leadframe substrate 125 depicted in FIG. 4D. As with the package 21 of FIG. 4C, the flat lid may be formed of any suitable material, such as a metal. Further, the flat lid 127 may be attached to the molded leadframe substrate 125 using an adhesive, such as epoxy or solder.

Figure 5A:
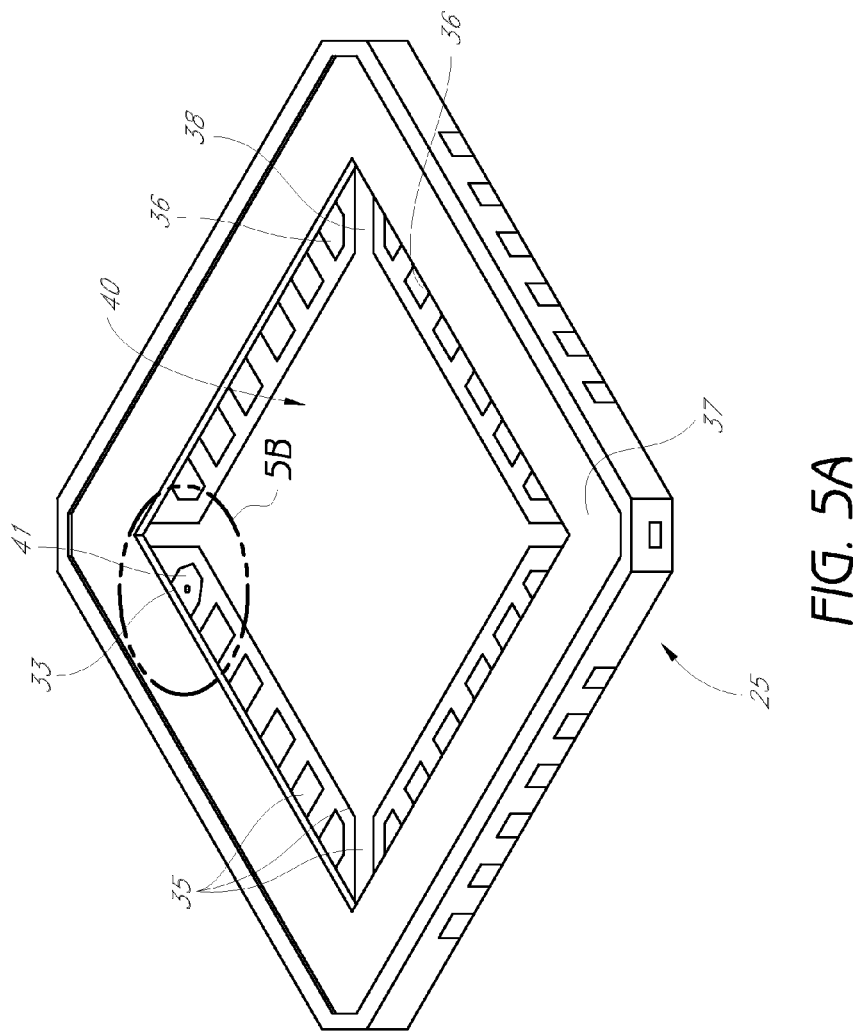
FIG. 5A shows a schematic perspective view of the upper surface of a molded leadframe substrate with a vent hole, according to one embodiment.

FIGS. 5A-D show detailed views of the molded leadframe substrate 25, according to one embodiment. FIG. 5A is a perspective view of the molded leadframe substrate 25. The molded leadframe substrate 25 has an upper surface 40 and a bottom surface 42 (see, e.g., FIGS. 5C-5D) opposite the upper surface 40. The molded leadframe substrate 25 includes a leadframe 35 and a molding material 37 surrounding portions of the leadframe 35. The leadframe 35 includes a plurality of metal features, including active leads 36, dummy leads 41, tie bars 38, and a die attach pad 39. The molding material 37 forms a portion of the bottom surface 42 of the molded leadframe substrate 25, and the bottom surface 42 is configured to be connected to a larger circuit, for example by connecting to a printed circuit board (PCB). For example, the leads 36 may be exposed on the bottom surface 42 of the molded leadframe substrate 25 in order to electrically couple to a mounting substrate or motherboard, e.g., a PCB. The die attach pad 39 is configured for receiving a MEMS device and/or IC device. As is known to the skilled artisan, leadframes can be provided by stamping or masking and etching processes. A half-etch process can provide overhanging portions on upper side edges of the metal features, such as to facilitate retention in the molding material 37.

FIG. 5B illustrates a magnified perspective view of the upper surface 40 of the molded leadframe substrate 25, showing a vent hole 33 formed through the molded leadframe substrate 25. Referring to FIG. 5B, at least one of the metal features of the molded leadframe substrate 25 includes the vent hole 33 which passes through the entire thickness of molded leadframe substrate 25. When the lid is attached to the molded leadframe substrate 25, thereby defining a cavity between the lid and the molded leadframe substrate 25, the vent hole 33 provides a path for air to pass into and out of the cavity, similar to the description of FIGS. 2A-B above. By permitting air to pass through the vent hole 33, increased pressure within the cavity may be released, reducing the risk of lid deformation or removal.

In the illustrated example, the vent hole 33 is formed in a dummy lead 41, e.g., an inactive lead that is not electrically connected to the die. In other embodiments the vent hole may be formed through other portions of molded leadframe 35. For example, the vent hole may be formed in the die attach pad 39, tie bars 38, active leads 36, or even in the molding material 37. Forming the vent hole 33 in metal portions of the molded leadframe 35, such as through the dummy lead 41, provides the advantage of enabling the use of standard lithographic techniques, rather than mechanical means of hole formation. For example, masking, patterning, and etching may be used to form a vent hole with significantly smaller dimensions than would otherwise be possible, and can be included in the pattern that defines the leadframe 35 itself, such that no additional steps are needed to form the vent hole. Moreover, forming the vent hole 33 through a metal feature of the substrate 25 on the same side of the package (e.g., the bottom surface 42) as the exposed external leads 36 advantageously permits sealing the vent hole 33 during board mounting, again without additional steps.

As noted, the vent hole 33 may be formed simultaneously with the fabrication of the leadframe 35 itself. This reduces the number of processing steps, enabling the vent hole 33 to be formed using the same techniques (e.g., lithography and etching) used to define and form the leadframe 35. In other embodiments, the vent hole 33 may be formed after the leadframe 35 has been formed. For example, the leadframe 35 may be etched or punched from a metallic sheet, after which the hole 33 may be formed using lithographic techniques, laser drilling, mechanical drilling, etc. If the vent hole 33 is formed prior to the application of the molding material 37, the vent hole 33 is preferably protected, e.g., by tape, when the molding material 37 is introduced over the leadframe 35.

FIGS. 5C-D illustrate magnified perspective views of the bottom surface 42 of molded leadframe substrate 25. As noted above, the vent hole 33 passes completely through the dummy lead 41 or other metal feature of the leadframe 35. The vent hole 33, in the illustrated embodiment, includes a step such that it has different diameters at different depths. The vent hole 33 includes an upper portion 45 closer to the upper surface 40 of molded leadframe substrate 25, and a lower portion 43 closer to the bottom surface 42 of the molded leadframe substrate 25. The upper portion 45 includes a smaller diameter opening, while the lower portion 43 has a larger diameter. The relatively larger diameter of lower portion 43 facilitates the introduction of a sealant into the lower portion 43 from the bottom surface 42 of the molded leadframe substrate 25 during mounting. For example, an amount of solder may be applied to the lower surface of the vent hole 33, thereby sealing the vent hole 33 and blocking any air from passing therethrough. The smaller diameter of upper portion 45 functions to minimize the amount of sealant that passes through the entire vent hole 33 to reach the upper surface 40 of molded leadframe substrate 25. The presence of a sealant, such as solder or other viscous adhesive, on the upper surface 40 of molded leadframe substrate 25 can lead to undesirable contamination within the cavity, and potential interference with operation of the die encapsulated therein. Accordingly, this dual-diameter configuration allows for effective sealing of the vent hole 33, while reducing the risk of contaminating the cavity with sealant passing through the entire vent hole 33 and reaching the upper surface 40 of molded leadframe substrate 25. Moreover, the dual-diameters can be readily defined during leadframe 35 definition using a standard half-etch process.

In other embodiments, the vent hole may contain only a single diameter throughout its entire length. Alternatively, in some embodiments the vent hole may contain more than two different diameters. Although illustrated as having a substantially circular cross-section, the vent hole may take any number of shapes, so long as the vent hole permits air to pass therethrough. For example, the vent hole may, in certain embodiments, have a cross-section that is rectangular, oval, an irregular polygon, or otherwise. Additionally, the vent hole need not include straight sidewalls. In some embodiments, the sidewalls may taper, forming a pyramid or conical structure.

The vent hole 33 may be formed using standard lithographic processes, for example masking, wet or dry etching, etc. Use of standard lithography allows for the formation of a vent hole 33 with very small dimensions, without the need for specialized tools. For example, the vent hole 33 may be circular (though as noted above, other shapes are possible) with a maximum width or diameter of between about 25 μm and about 1 mm, more particularly between about 50 μm and about 150 μm. Alternatively, the vent hole 33 may be formed by non-lithographic techniques, for example laser drilling or mechanical drilling.

After the die is mounted onto the die attach pad 39 of molded leadframe substrate 25, the package lid 27 (see, e.g., FIG. 4B) may be affixed to the molded leadframe substrate 25, thereby encapsulating the die. With the package lid 27 sealed to the molded leadframe substrate 25, the cavity may be hermetically sealed except for the presence of the vent hole 33. As described above, the vent hole 33 may be sealed. For example, solder may be used to fill the lower portion of the vent hole 33 and thereby seal the cavity. The sealing process may occur during mounting the package onto a mounting substrate. The mounting substrate may be, for example, a printed circuit board. Sealing the vent hole may provide protection against any undesired contaminants which may enter the open vent hole and potentially damage or interfere with operation of the die.

In other embodiments, the vent hole may remain unsealed, even after mounting the packaged MEMS device onto a mounting substrate. Depending on the application, it may be desirable to keep the vent hole open after mounting. For example, MEMS accelerometers used in certain automobile applications may be subject to substantial thermal cycling, in which the packaged MEMS device experiences wide ranges of temperatures. As described above, an open vent hole may provide an outlet to release pressure within the cavity, and thereby avoid displacement of the package lid during operation of the integrated device under high temperatures. Locating the vent hole on the lower surface, whether or not sealed, can minimize access by contaminants while permitting venting to prevent over- or underpressurization.

It should also be appreciated that, while the molded leadframe substrate 25 shown in FIGS. 5A-5D may be similar to or the same as the molded leadframe substrate 25 illustrated in FIGS. 4A-4C (e.g., without a wall extending from a base), the vent hole 13 can be similarly implemented in the molded leadframe substrate 125 illustrated and described with respect to the arrangement of FIGS. 4D-4F. In such embodiments, for example, the vent hole may be formed through the entire thickness of the base 126 of the molded leadframe substrate 125.

Printed Circuit Board Package Substrate

Another example of a package housing 108 (FIG. 2A) is shown in FIGS. 6A and 6B. In this embodiment, a device package 201 including a plastic (e.g., PCB) package substrate 205 is formed according to the process depicted in FIG. 3A and described above. The housing includes the plastic package substrate 205 and a package lid 207, together defining a cavity 211 in which an integrated device die 203 is mounted. As above, an adhesive 209 can be applied to bond the lid 207 to the package substrate 205. In other embodiments, the package substrate 205 may be formed of a ceramic or semiconductor material. Further the die 203 can be a MEMS die, for example, the die 203 can be a motion sensor die, such as a gyroscope or accelerometer.

Returning to Block 17 of FIG. 3A and turning to the embodiments illustrated in FIGS. 6A and 6B, the package substrate 205 is provided with a vent hole 213. In this embodiment, the package substrate 205 is a PCB. PCB is often used to mechanically and electrically couple electronic or microelectromechanical systems (MEMS) dies to external circuits. In some embodiments, the PCB is formed of a polymer material, while in other embodiments the PCB may be ceramic or any other suitable insulating material. Layers of patterned electrically conductive material may be laminated onto or otherwise interleaved with insulating material to form electrical interconnects. In many applications, the electrically conductive material is a metal, such as copper, but one skilled in the art will recognize that other conductive materials are suitable. The package substrate 205 may also include one or more electrical leads 221 on the bottom surface of the package substrate 205. The electrical leads 221 are often used to electrically couple signals from the package substrate 205 to an external circuit, such as by way of another PCB or other electronic system.

The dimensions of the substrate vary depending on the particular application. In some embodiments, the package substrate 205 ranges between about 3-4 millimeters across, while in other embodiments the package substrate may be much larger or smaller, depending on the particular application. The thickness of the package substrate 205 may be approximately 0.3 mm in some embodiments, although the thickness could range from about 0.1 mm to about 10 mm in other applications. In other embodiments, the thickness could be larger or smaller.

FIG. 6A shows a side cross-sectional view of the device package 201. The vent hole 213 may be formed in any suitable way known to one of skill in the art. Methods of forming the vent hole 213 may include mechanical drilling, dry or wet etching, laser drilling, or other mechanical means. In one embodiment, the vent hole is configured to release air from air cavity 211 when the lid 207 is attached to the packaging substrate 205 and the adhesive 209 is cured or solidified (see Blocks 23 and 25 of FIG. 3A), and during at least part of subsequent board mounting (see block 27 of FIG. 3A and the flowchart of FIG. 3B). The vent hole 213 is a through hole, extending from an upper surface 240 of the package substrate 205 to a bottom or lower surface 242 of the package substrate 205. The vent hole 213 cross-section may be of any suitable shape, and is circular in the illustrated embodiment. The dimensions of the vent hole 213 vary with the particular application. In general, smaller vent holes 213 have the advantage of minimizing contamination and facilitating subsequent sealing. For example, vent holes 213 can have (for round holes) diameters between about 50 μm and about 1 mm. For plastic substrates, technology typically employed for patterning PCB material can readily provide holes with widths in the range of about 100-600 μm without undue expense. While the device package 201 of FIG. 6A shows only one vent hole 213 in the package substrate 205, multiple vent holes can be provided. The location of the vent hole 213 on the package substrate 205 may also vary according to the preferred application. In some embodiments, the vent hole 213 is preferably laterally spaced or separated from the location of the die 203 on the package substrate 205. The vent hole 213 may also be electrically isolated from the die 203. A portion of the vent hole 213 intersects the bottom surface 242 of the package substrate 205 and defines a perimeter on the bottom surface 242 of the substrate 205.

In one embodiment, the package substrate 205 includes an annular trace 222 around the perimeter of the vent hole 213 on the bottom surface 242 of the package substrate 205. The trace 222 can facilitate mechanically coupling the package substrate 205 to an external circuit in step 27 of FIG. 3A and in FIG. 3B, such as to an external PCB or other mounting substrate 215. The annular trace 222 may be of any suitable shape to surround the vent hole 213. In one embodiment, the annular trace 222 is circular, although other shapes (such as a quadrilateral or other polygon) might be acceptable in some cases. The annular trace 222 is preferably formed from a metal, such as copper, aluminum, silver, stainless steel, or gold, which allows for the annular trace 222 to be soldered, e.g., to a PCB for connection to an external circuit (see FIG. 6B, block 27 of FIG. 3A, and FIG. 3B). Of course, for other applications, the annular trace 222 may be formed of any other suitable material that facilitates coupling the package substrate 205 to external systems. The annular trace 222 can be formed by any suitable mechanical or lithographic process, such as the same PCB manufacturing techniques used to define external leads 221 on the bottom of the package substrate 205. In the illustrated embodiment, the annular trace 222 is electrically isolated from electrical interconnects or other traces within or on the package substrate 205, such that the trace 222 serves solely to aid sealing of the vent hole 213 in subsequent board mounting. In other embodiments, the annular trace can be electrically connected to other traces, such that the trace can serve dual functions of aiding sealing of the vent hole and for electrical connection to the die(s) within the package.

Returning to Block 19 of FIG. 3A, an integrated device die is attached to the package substrate. In FIG. 6A, the die 203 comprises a motion sensor, such as a MEMS accelerometer or gyroscope, but the die 203 may also be an integrated circuit die or any other die selected by the device designer. The die 203 may be electrically coupled to bond pads on the package substrate 205, such as by wire bonding, solder bumping or other suitable technique. While the device package 201 of FIG. 6A only illustrates one die 203, the device package 201 may include multiple dies, such as a MEMS die and an IC processor.

In Block 21 of FIG. 3A, an adhesive 209 is applied to the package substrate, and in Block 23 the package lid 207 is attached to the substrate 205. In FIG. 6A, the adhesive 209 is applied to the upper surface 240 of the package substrate 205. In some embodiments the adhesive 209 can be an epoxy, which can be conductive. Conductive epoxies can be used to electrically connect a conductive or conductively coated package lid 207 to ground, which can then shield the die 203 from possibly undesirable electromagnetic radiation. Some suitable epoxies may include silver or other conductive filler. In yet other embodiments the epoxy is not conductive or only slightly conductive. Adhesive 209 may also be solder in some embodiments, however, in many applications, epoxy is preferable to avoid solder flux contamination of the die 203, as noted above.

As shown in FIGS. 6A and 6B, package lid 207 substantially encloses the die 203 and forms a cavity 211 within device package 201. The presence of the cavity 211 allows the die 203 to be physically separated from the package lid. Integrated packages that use an encapsulant (e.g., glob top or molded encapsulant) can exert mechanical stress on the die due to a mismatch in the coefficients of thermal expansion between the encapsulant and the die. The cavity-based package configuration of FIGS. 6A and 6B avoids such stresses by permitting air to enter and exit the cavity 211 by way of the vent hole 213. While the die 203 of FIG. 6A is a MEMS motion sensor die, the embodiments described herein may also be useful in other devices (such as integrated circuits or other electronic or mechanical devices) where the application is sensitive to high mechanical stresses induced by thermal mismatch.

In Block 25 of FIG. 3A, the adhesive 209 is cured or otherwise solidified. The curing process 25 completes the sealing of the lid to the package substrate by hardening the liquid epoxy material or solder. To cure the epoxy and effectuate the seal, one type of epoxy may be heated to temperatures exceeding about 150° C. for an extended period of time, e.g., greater than 20 minutes, although higher or lower temperatures may be used in the curing step 25, depending upon the selected epoxy material. In one example, the curing process 25 is conducted for about 1 hour at about 175° C. The curing process 25 may be performed in an oven or using any other suitable heating technique.

With reference back to FIG. 6A, as noted above, the temperature within the package cavity 211 increases during the curing process 25. The vent hole 213 in the package substrate 205 allows air to escape from the cavity 211 during the curing process 25, thus avoiding tilting, warping or popping off of the lid 207. As a result, the vent hole 213 may improve device integrity and package yield by reducing mechanical stress on the adhesive 209 and lid 207 during curing.

Turning to FIG. 6B (see also FIG. 3B and Block 27 of FIG. 3A), the device package 201 is mounted to mounting substrate 215 to form a mounted device package 219. The mounting substrate 215 may be a PCB or any other suitable electronic interface or device. Mounting substrate 215 often acts to connect the device package 201 to a larger external circuit, such as an automobile or a smart phone. In the illustrated embodiment, mounting the device package 201 includes forming electrical connections between leads 221 and traces on the mounting substrate 215. For example, such connections can be made by solder joints 217, which serve to provide both mechanical and electrical connections. Simultaneously, the vent hole 213 can be sealed during the mounting process. In the illustrated example, the solder pattern applied for forming electrical connections can also be applied to the annular trace 222 surrounding the vent hole 213 on the bottom surface of the package substrate 205.

FIG. 7A illustrates a bottom view of the package substrate 205. The vent hole 213 is shown in FIG. 7A, and the annular trace 222 is positioned substantially around the perimeter of the vent hole 213 on the bottom surface 242 of the package substrate 205. The package substrate 205 also preferably includes at least one external lead 221. The leads 221 are preferably formed from a metal such as copper, although other suitable materials may be used. Leads 221 may act as electrical connections between the die 203 and the mounting substrate 215. The leads 221 may transmit signals between the die 203 and the mounting substrate 215, or the leads 221 may be electrically grounded. Alternatively, some metallic traces on the bottom surface 242 of the package substrate 205 may be used only as a mechanical support structure for mounting the package substrate 205 to the mounting substrate 215. Although as noted above annular trace 222 can be electrically isolated from other traces and thus from the die within the package, in other arrangements the annular trace 222 can serve the additional role of an electrical lead with electrical connection to the die 203 by way of traces within or on the package substrate 205.

FIG. 7B illustrates a top view of the mounting substrate 215. The mounting substrate 215 preferably includes at least one landing pad 224, which is preferably made of a conductive, typically metallic material. The landing pads 224 may be electrically connected to the corresponding leads 221 on the package substrate 205, thereby transferring signals from the die 203 to the larger system. The annular sealing structure 227 is also positioned on the upper surface of the mounting substrate 215 and mechanically couples to the annular trace 222 of the package substrate 205.

When the package substrate 205 is attached to the mounting substrate 215, the vent hole 213 can be simultaneously sealed. In the embodiment of FIGS. 6B, 7A and 7B, the solder is applied to landing pads 224 and/or to corresponding leads 221 of the package substrate 205 prior to attachment. The solder joints 217 serve to both mechanically couple the package substrate 205 to the mounting substrate 215 and electrically couple the die 203 to the larger external circuit via the landing pads 224.

In FIGS. 6B, 7A, and 7B, the annular trace 222 is preferably attached to the annular sealing structure 227 of the mounting substrate 215. Like the leads 221, the annular trace 222 may be coupled to the annular sealing structure 224 via a solder joint 217. The process employed to apply solder to the package substrate 205 and/or the mounting substrate 224 for connecting leads 221 to landing pads 224 can simultaneously provide solder on the annular trace 222 and/or annular sealing structure 227, such that the vent hole 213 can be sealed without an additional step.

As noted above, the solder reflow process used to form the solder joint 217 may also increase the temperature of the cavity 211, resulting in increased air pressure within the cavity 211. Moreover, because solder reflow temperatures often exceed the epoxy reflow temperature, the increased temperature may also soften the adhesive 209 that connects the lid 207 with the package substrate 205. To help alleviate pressure during the soldering process, the solder may initially be applied in an incomplete annulus to leave a small gap or vent hole in the solder joint that couples the annular trace 222 with the annular sealing structure 224. Leaving a small gap when designing the solder stencil allows air to escape during the initial stages of solder reflow process, which reduces mechanical stresses induced in the adhesive 209 and lid 207. The small gap can be dimensioned such as to be self-sealing as the solder is wetted during the solder reflow process.

As discussed above, in many applications, it may not desirable to leave a vent hole exposed to the environment in the finished product (after mounting the package), as particles may enter the package and damage the die, package substrate, or other components. The structures and methods described herein provide a simple process for sealing the vent hole while mounting and connecting the package into a larger circuit. If desired, the hole can be left unsealed, such as to allow venting in the finished product, which can be advantageous for applications subject to large temperature swings.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A device package comprising:
    a package housing defining a cavity;
    a motion sensor die mounted within the housing; and
    a hole extending through the housing, wherein the housing has a bottom surface comprising at least one electrical lead configured to convey electrical signals between the device package and a external board, the hole extending through the bottom surface.

2. The device package of claim 1, wherein the housing comprises a package substrate and a lid attached to the package substrate, the hole extending through the package substrate.

3. The device package of claim 2, wherein the hole is sized to release air from the cavity when the lid is attached to the package substrate.

4. The device package of claim 2, wherein the lid is attached to the package substrate using an epoxy.

5. The device package of claim 2, wherein the motion sensor die comprises a microelectromechanical systems (MEMS) accelerometer.

6. The device package of claim 2, wherein the motion sensor die comprises a microelectromechanical systems (MEMS) gyroscope.

7. The device package of claim 2, wherein the hole is laterally spaced from the motion sensor die.

8. The device package of claim 2, wherein the package substrate is mounted on and electrically connected to an external board, the hole being sealed to prevent communication therethrough.

9. The device package of claim 8, wherein the hole is sealed by solder or epoxy.

10. The device package of claim 2, wherein the lid comprises a conductive material, and wherein the lid is attached to the package substrate by an epoxy material.

11. The device package of claim 10, wherein the epoxy material is electrically conductive.

12. The device package of claim 2, wherein the package substrate comprises a plastic material.

13. The device package of claim 2, wherein the package substrate comprises a printed circuit board (PCB).

14. The device package of claim 13, comprising an annular metal trace on the bottom surface of the housing, and wherein the annular metal trace surrounds the hole.

15. The device package of claim 14, wherein the annular metal trace is not electrically connected to any circuit.

16. The device package of claim 2, wherein the package substrate comprises a molded leadframe.

17. The device package of claim 16, wherein the device package is a leadframe chip scale package (LFCSP) or a small-outline integrated circuit (SOIC) package.

18. The device package of claim 16, wherein the hole is formed through a metallic portion of the leadframe.

19. The device package of claim 18, wherein the hole is formed through a dummy lead.

20. The device package of claim 16, wherein the hole comprises an upper portion adjacent to an upper surface of the package substrate, and a lower portion adjacent to a bottom surface of the package substrate, wherein the cross-sectional area of the hole is larger in the lower portion than in the upper portion.

21. The device package of claim 2, wherein the lid is shaped to form a concavity.

22. The device package of claim 2, wherein the package substrate includes a base and a wall extending from the base, and wherein the lid is substantially planar.

23. A method of integrating a motion sensor device package with an outside electronic circuit, the method comprising:
    providing a package substrate with a vent hole therethrough, the package substrate having bottom surface comprising at least one electrical lead configured to convey electrical signals between the device package and an external board, the vent hole extending through the bottom surface;
    mounting a motion sensor die on the package substrate; and
    attaching a lid to the package substrate to form a housing enclosing the motion sensor die in a cavity but for the vent hole.

24. The method of claim 23, wherein attaching the lid comprises applying epoxy and curing the epoxy at greater than about 150° C.

25. The method of claim 24, wherein the epoxy is electrically conductive.

26. The method of claim 23, further comprising mounting the package substrate to an external board after attaching the lid.

27. The method of claim 26, wherein mounting the package substrate comprises simultaneously sealing the vent hole.

28. The method of claim 27, wherein the package substrate comprises a molded leadframe, the vent hole is formed in a metal feature of the molded leadframe, and sealing comprises applying solder to the vent hole.

29. The method of claim 27, wherein the package substrate comprises a printed circuit board (PCB) including an annular metal trace surrounding the vent hole, and sealing comprises applying solder to the metal trace.

30. The device package of claim 1, wherein a metal is disposed at least partially around the hole on at least the bottom surface of the housing.

31. The device package of claim 30, wherein the metal substantially surrounds the hole on at least the bottom surface of the housing.

32. The device package of claim 30, further comprising metal on an inner wall of the hole.

33. The device package of claim 32, wherein the housing comprises a package substrate, the package substrate comprising a leadframe, the hole formed through the leadframe.

34. The device package of claim 30, wherein the metal comprises an annular metal ring.

35. The device package of claim 34, wherein the housing comprises a printed circuit board (PCB) substrate and a lid attached to the PCB substrate.

36. The device package of claim 31, wherein the housing comprises a leadframe and a lid attached to a portion of the leadframe, the leadframe comprising the metal.

37. The device package of claim 30, wherein the metal does not electrically communicate with the motion sensor die.

38. The device package of claim 37, wherein the metal is electrically isolated from the other components of the device package.

39. An assembly comprising:
the device package of claim 1;
an external board; and
an adhesive attaching the device package to the external board, the adhesive at least partially filling the hole.

40. The assembly of claim 39, wherein a first portion of the adhesive at least partially fills the hole and a second portion of the adhesive is disposed between the housing and the external board.

41. The assembly of claim 39, wherein the adhesive comprises solder.

42. The assembly of claim 39, wherein the adhesive comprises an epoxy.

43. The assembly of claim 39, wherein a metal is disposed at least partially around the hole on at least the bottom surface of the housing.

44. The assembly of claim 43, wherein the metal substantially surrounds the hole on at least the bottom surface of the housing.

45. The assembly of claim 43, further comprising metal on an inner wall of the hole.

46. The assembly of claim 45, wherein the housing comprises a package substrate, the package substrate comprising a leadframe, the hole formed through the leadframe.

47. The assembly of claim 43, wherein the metal comprises an annular metal ring.

48. The assembly of claim 47, wherein the housing comprises a printed circuit board (PCB) substrate and a lid attached to the PCB substrate.

49. The assembly of claim 44 wherein the housing comprises a leadframe and a lid attached to a portion of the leadframe, the leadframe comprising the metal.

50. The assembly of claim 39, wherein the hole is laterally spaced from the motion sensor die.

51. The assembly of claim 43, wherein the metal does not electrically communicate with the motion sensor die.

52. The assembly of claim 51, wherein the metal is electrically isolated from the other components of the device package.

53. The assembly of claim 39, wherein the motion sensor die comprises a microelectromechanical systems (MEMS) die.

* * * * *

UNITED STATES PATENT AND TRADEMARK OFFICE
CERTIFICATE OF CORRECTION

PATENT NO. : 8,853,839 B2
APPLICATION NO. : 13/645094
DATED : October 7, 2014
INVENTOR(S) : Gao et al.

Page 1 of 1

It is certified that error appears in the above-identified patent and that said Letters Patent is hereby corrected as shown below:

In the Claims

In Claim 1, column 15, line 40, please replace "and a" with -- and an --.

In Claim 23, column 16, line 37, please replace "having" with -- having a --.

Signed and Sealed this
Twenty-first Day of April, 2015

Michelle K. Lee
*Director of the United States Patent and Trademark Office*